(12) United States Patent
Aytur et al.

(10) Patent No.: US 8,416,870 B2
(45) Date of Patent: Apr. 9, 2013

(54) AUTOMATIC GAIN CONTROL FOR FREQUENCY-HOPPED OFDM

(75) Inventors: Turgut Aytur, Plattsburgh, NY (US); Stephan ten Brink, Irvine, CA (US); Ravishankar H. Mahadevappa, Irvine, CA (US); Ran Yan, Irvine, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/372,577

(22) Filed: Feb. 14, 2012

(65) Prior Publication Data

US 2012/0140794 A1 Jun. 7, 2012

Related U.S. Application Data

(62) Division of application No. 13/044,157, filed on Mar. 9, 2011, which is a division of application No. 11/506,754, filed on Aug. 18, 2006, now Pat. No. 7,916,798.

(60) Provisional application No. 60/709,542, filed on Aug. 18, 2005.

(51) Int. Cl.
*H04K 1/10* (2006.01)
*H04L 27/28* (2006.01)

(52) U.S. Cl. ........ 375/260; 375/316; 375/324; 375/340; 375/345

(58) Field of Classification Search .................. 375/345, 375/260, 316, 324, 340
See application file for complete search history.

(56) References Cited

U.S. PATENT DOCUMENTS

| | | | |
|---|---|---|---|
| 6,363,127 B1 | 3/2002 | Heinonen et al. | |
| 6,574,292 B2 | 6/2003 | Heinonen | |
| 6,843,597 B1 | 1/2005 | Li et al. | |
| 6,868,263 B2 | 3/2005 | Filipovic | |
| 7,065,165 B2 | 6/2006 | Heinonen et al. | |
| 7,099,641 B2 | 8/2006 | Bruckmann et al. | |
| 7,245,893 B1 * | 7/2007 | Husted et al. | ............. 455/226.3 |
| 7,356,322 B2 | 4/2008 | Hammerschmidt et al. | |
| 7,512,378 B2 | 3/2009 | Rofougaran et al. | |

* cited by examiner

*Primary Examiner* — Ted Wang
(74) *Attorney, Agent, or Firm* — McClure, Qualey & Rodack, LLP

(57) ABSTRACT

An automatic gain control method and system for use in signal processing of OFDM symbols at a receiver. Two stages of coarse and fine automatic gain control are implemented that adjust different gains in an analog RF processing stage of the receiver. Gain of a low noise amplifier and a mixer are adjusted during a first and coarse automatic gain control stage based on feedback from a digital baseband stage. During a subsequent fine gain control period, the gain of a programmable gain amplifier is adjusted separately for each frequency band used by the OFDM symbols based on a histogram bin that counts the number of output samples of an analog to digital converter whose magnitude falls within certain ranges. Coarse and fine gains are updated after each OFDM symbol.

17 Claims, 12 Drawing Sheets

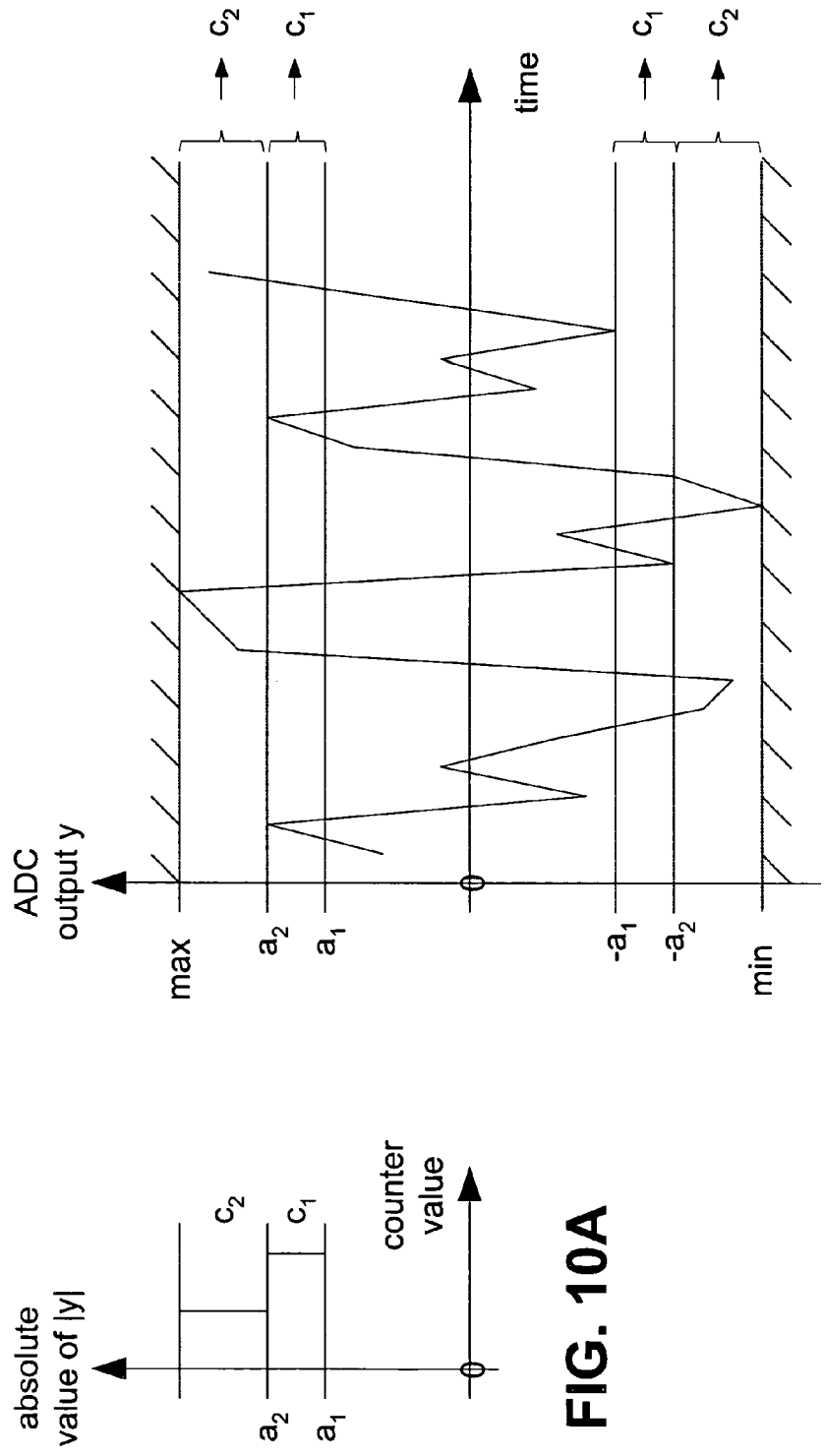

AUTOMATIC GAIN CONTROL FOR FREQUENCY-HOPPED OFDM

CROSS-REFERENCE TO RELATED APPLICATION

The present application is a divisional of U.S. application Ser. No. 13/044,157, filed Mar. 9, 2011, which is a divisional of U.S. application Ser. No. 11/506,754, filed Aug. 18, 2006, which claims priority to the U.S. Provisional Patent Application No. 60/709,542 filed on Aug. 18, 2005, the entire contents of which are incorporated herein by reference.

BACKGROUND OF THE INVENTION

The present invention relates generally to ultrawideband (UWB) communications, and more particularly to automatic gain control (AGC) in a receiver of UWB communications.

UWB communication systems communicate information using what may be considered a large portion of frequency spectrum. For example, UWB systems may use frequencies between 3.1-10.6 GHz. This portion of the frequency spectrum may also be used by other communication systems.

Many proposed UWB systems are expected to use orthogonal frequency division multiplexing (OFDM). An OFDM carrier signal is the sum of a number of orthogonal subcarriers. Baseband data on each subcarrier is independently modulated. An example of OFDM symbol structure and frequency hopping patterns are disclosed in Multiband OFDM Physical Layer Specification, Release 1.0, Jan. 14, 2005, which is incorporated herein by reference.

A receiver of an OFDM UWB communication performs a variety of signal processing operations on the OFDM symbols received. The signal including the OFDM symbols may have range of levels or strengths over the spectrum of the UWB communication. The signal processing steps or components may each impart a gain to the signal and the gain may vary depending on the frequency of each portion of the signal. Changes in the input signal level as a function of frequency may distort the signal and impair further processing steps. Appropriately setting the gain of a received signal is therefore of some importance. Unfortunately, UWB transmissions may be bursty, or considered bursty in view of potential frequency hopping, limiting time for performing automatic gain control (AGC) operations and also potentially increasing the difficulty of performing such operations.

SUMMARY OF THE INVENTION

The invention provides automatic gain control functions for a receiver, such as a wireless receiver. In one aspect the invention provides a system for performing automatic gain control during signal processing of OFDM symbols at a receiver, the system comprising a first stage adapted to receive signals from a receiver antenna and configured to apply a first gain to received signals; and a second stage including a programmable gain amplifier (PGA), the second stage coupled in series with the first stage, the second stage being adapted to provide amplified signals to an analog to digital converter (ADC), and configured to apply a second gain to signals generated by the first stage, the ADC being adapted to provide digitized output to a digital baseband processor, wherein the first stage is adapted to receive a first gain setting signal, the first stage configured to adjust the first gain based on the first gain system signal; wherein the second stage is adapted to receive a second gain setting signal, the second stage configured to adjust the second gain based on the second gain setting signal.

In another aspect the invention provides a method for adjusting a gain imparted to a signal received at a receiver, the method comprising initializing a first gain setting to a maximum and initializing a second gain signal to a maximum; amplifying a received signal based on the first gain setting and the second gain setting; adjusting the first gain setting based on an indication of received signal power; and adjusting the second gain setting based on values provided by digitizing the amplified received signal.

In another aspect the invention provides A method for performing automatic gain control during a signal processing of OFDM symbols in a received signal at an RF receiver, the OFDM symbols arriving at the RF receiver in different frequency subbands according to a pattern indicated by a time-frequency code (TFC) for frequency subband hopping, the RF receiver having a first gain, a second gain, and a third gain operating in series on the OFDM symbols, the third gain including parallel gains, a number of the parallel gains being equal to a number of the different frequency subbands, each parallel gain corresponding to one of the frequency subbands, each parallel gain having a gain corresponding to a gain index, the method comprising initializing the first gain, the second gain, and the parallel gains of the third gain to a highest value for each; amplifying the OFDM symbols in all of the frequency subbands by the first gain and the second gain, amplifying the OFDM symbols in each of the frequency subbands by the corresponding parallel gain; measuring an indication of a strength of the received signal to obtain a received signal strength indication; obtaining a first-second gain combination from a look-up table corresponding to the received signal strength indication; adjusting the first gain and the second gain by values corresponding to the first-second gain combination; digitizing a result of the third gain to obtain digitized outputs; counting a first number of the digitized outputs having absolute values falling within a first range and a second number of digitized outputs having absolute values falling above the first range; changing the gain index if the first number and the second number exceed or fall below predetermined limits; and adjusting the third gain by adjusting each of the component gains to values corresponding to the changed gain index.

These and other aspects of the invention are more fully comprehended upon consideration of the following and the accompanying figures.

BRIEF DESCRIPTION OF THE DRAWINGS

FIG. 10A shows a two-bin histogram for fine AGC according to the aspects of the present invention.

FIG. 10B shows the number of output samples of an analog to digital converter (ADC) exceeding certain threshold values versus time according to the aspects of the present invention.

DETAILED DESCRIPTION

Figure 1:
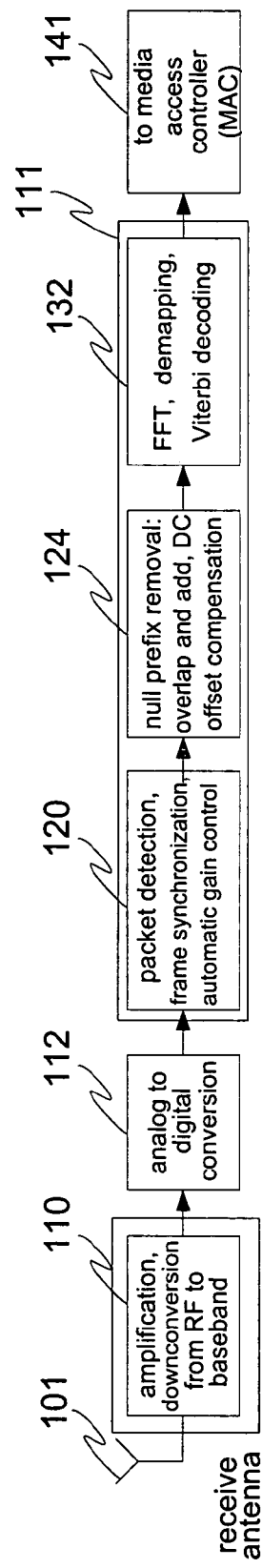
FIG. 1 shows an overview of a receiver in a communication system according to the aspects of the present invention.

FIG. 1 shows an overview of a physical layer for a receiver in a communication system according to the aspects of the invention. The receiver of FIG. 1 includes an analog RF block 110 and a digital baseband block 111 that are coupled through an analog to digital conversion (ADC) block 112. A signal transmitted by a transmitter and received by the receiver at an antenna 101 is in analog form. The analog RF block 110 amplifies the signal and downconverts it from radio frequency to baseband. The ADC block converts the baseband analog signal to a digital signal. The digital baseband block 111 further processes the signal, and provides the processed signal to a MAC 141.

In one embodiment, the receiver shown in FIG. 1 may receive at the receiver antenna OFDM symbols. The OFDM symbols are processed through the analog RF processing block 110. The analog RF processing block 110 may include an amplification block and a downconversion block, for amplification and downconversion from RF to baseband. During downconversion by the analog RF block 110, a frequency hopping pattern of the OFDM symbols may be taken into account. The frequency hopping pattern may be determined according to a time-frequency code (TFC) number. The hopping pattern is provided to the downconversion process by a media access controller (MAC).

After analog RF processing the signals are digitized by the ADC block 112. The ADC block 112 is coupled to the digital baseband processing block 111, which includes a signal processing block 120 followed by a number of data processing blocks that further process the data resulting from the signal processing part before the data is provided to the MAC 141. As illustrated in FIG. 1, the digital baseband block includes a signal processing packet detection, frame synchronization and automatic gain control (AGC) determination block 120. A null prefix removal, overlap and add, and DC offset compensation block 124, and an FFT, demapping, and decoding block 132. In many embodiments each of these blocks may themselves include blocks, for example the FFT, demapping, and decoding blocks may each be implemented as their own blocks, generally in circuitry, but as programming in a processor in some embodiments.

In many embodiments the receiver is a receiver for a packet-based communication system, preferably for OFDM time frequency hopping communications. In such receivers, and receivers of other embodiments, AGC may be performed to adjust the amplification of the received signal. For example a received signal strength indication (RSSI) signal may be generated by the analog RF block 110. AGC determination circuitry may use an analog-to-digital converted version of the RSSI as a measure of the RF power of the received signal. An appropriate control signal may be generated during the processing by the signal processing block 120 and fed back for use by the analog RF processing block 110 to control gains imparted to the received signal. AGC may include controlling the gains of several components. In some embodiments, AGC may include the computation of gain settings for a low-noise amplifier (LNA), a mixer, and a programmable gain amplifier (PGA).

Figure 2:
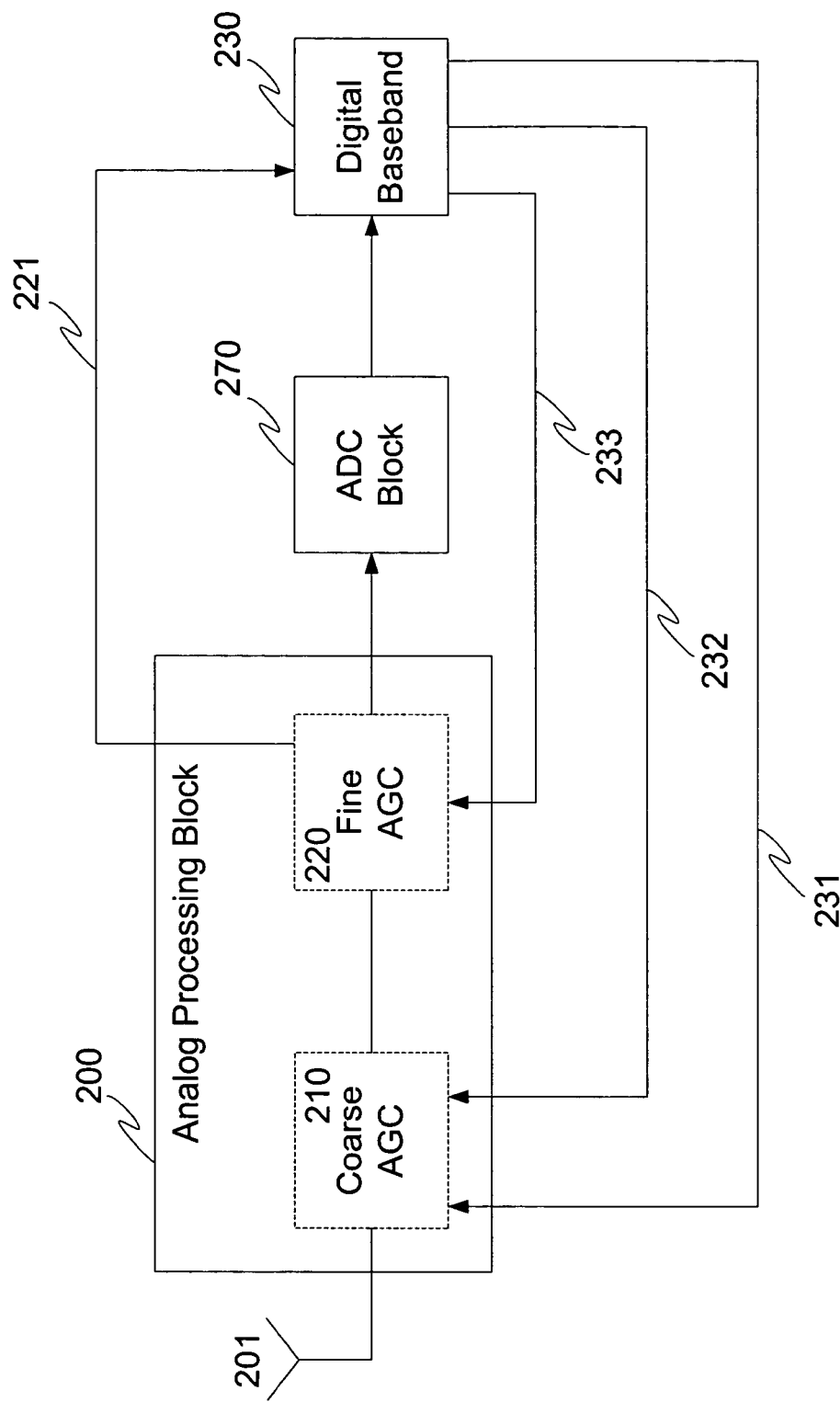
FIG. 2 shows an overview of a two-stage automatic gain control (AGC) system according to the aspects of the present invention.

FIG. 2 is a block diagram of portions of a receiver including two-stage AGC operation in accordance with aspects of the invention. An analog processing block 200, generally including RF analog circuitry, may be considered as including a coarse AGC portion 210 and a fine AGC portion 220. In many embodiments the course AGC portion includes a low noise amplifier (LNA) and a mixer, and the fine AGC portion includes an amplifier chain including at least one programmable amplifier. The coarse AGC portion 210 receives an input signal from an antenna 201 and provides a gain to the signal based on a course AGC gain signal 232, provided by a digital baseband block as illustrated in FIG. 2. The fine AGC portion 220 receives the signal from the coarse AGC portion. The fine AGC portion also provides a gain to the signal, with the gain dependent on a fine AGC signal provided by the digital baseband. Output of the fine AGC portion is converted from analog format to digital format by an ADC block 270.

In some embodiments, the two gain stages, course AGC and fine AGC, are used to control the input to the ADC block such that clipping of the signal amplitude by the ADC is kept at a predetermined level. Thus, the feedback control signals 232, 233 may be determined by the digital baseband based on signal levels provided by the ADC. In many embodiments, however, and as illustrated in FIG. 2, an RSSI signal 221 is provided by the analog processing block. The digital baseband may use the RSSI to determine AGC gain settings, either alone or in conjunction with other signals, such as outputs of the ADC.

A UWB signal received by the antenna 201 may include several frequency subbands. When the received signal includes several frequency subbands, a band-select signal 232 from the digital baseband stage may be used by circuitry of the coarse AGC portion, as described including for example a mixer or multiple mixers, to select the subbands that are to be downconverted from RF to baseband frequency. The band-select signal may be based on a frequency hopping pattern indicated by a TFC number. In some embodiments gain settings for the course AGC portion or the fine AGC portion, or both, may use different gain settings based on a subband indicated by the band-select signal. For example, the fine AGC stage may include separate components corresponding to each frequency subband such that a different gain may be implemented for each subband. Also for example, the fine AGC portion may include parallel PGAs, each parallel PGA amplifying or attenuating a signal transmitted on a particular frequency subband.

Figure 3:
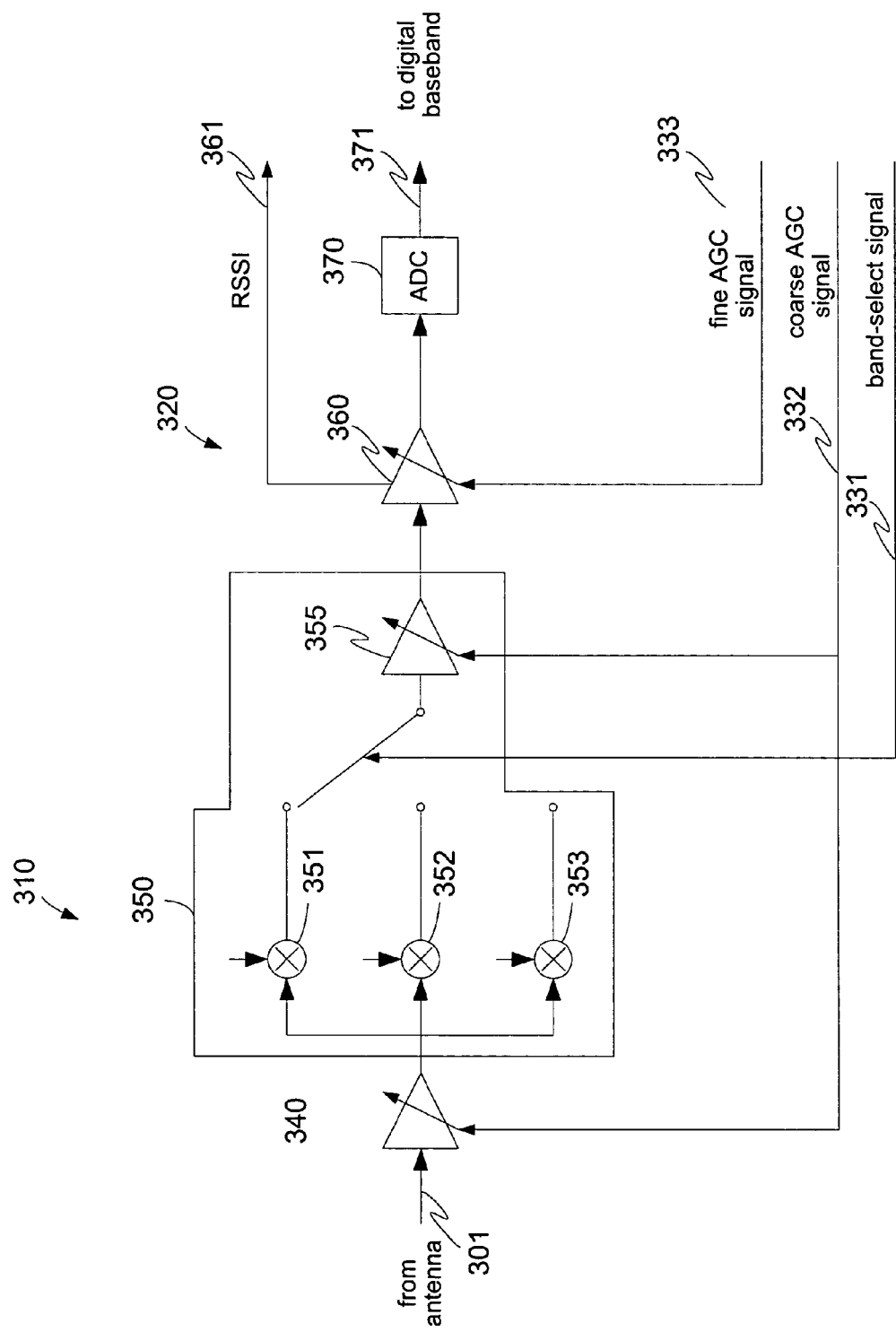
FIG. 3 shows an exemplary architecture for an analog RF block according to the aspects of the present invention.

FIG. 3 shows an exemplary architecture for an analog RF block in accordance with the aspects of the invention. In some embodiments, the analog RF block is used in a receiver such as the receiver of FIG. 1. The analog RF block of FIG. 3 includes a first stage AGC portion 310 and a second stage AGC portion 320 coupled together in series. The first stage AGC portion 310 provides a coarse AGC gain and the second stage AGC portion 320 provides a fine AGC gain to a received signal. The first stage AGC portion receives a signal 301 from a receiver antenna. As illustrated in FIG. 3, the first stage AGC portion includes an LNA 340 coupled to a mixer 350.

The signal 301 from the receiver antenna is amplified by the LNA 340, with the gain dependent on a course AGC signal 332. In one implementation, the amplification gain is controllable to levels of 10 dB, 21 dB and 27 dB. The LNA is coupled to the mixer 450. The mixer down-converts the received signal baseband. In most embodiments the mixer inherently includes a gain, although the gain is shown as a separate amplifier 355 in FIG. 3 for convenience. In one implementation, the mixer gain of the mixer 350 can be controlled to levels of −13 dB, −7 dB, −1 dB, and +5 dB. The −13 dB, −7 dB, and −1 dB levels are attenuations, but for convenience both attenuation and amplification, such as +5 dB amplification, are both generally simply referred to as "amplification."

As illustrated, the mixer 350 performs down-conversion of various subbands from RF to baseband. For example, if the received signal is expected to be provided at three frequency subbands, with a particular sub-band used at any instance, the mixer 350 may include three mixer 351, 352, 353 each mixing the received and amplified RF signal with a mixing signal of a different frequency, with an output of the various mixers selected using the band-select signal 331.

For example, communications received by a receiver may include OFDM symbols that are transmitted over multiple frequency subbands. Each symbol may occupy a different subband and the consecutive OFDM symbols may hop from subband to subband according to a time-frequency code (TFC) that is assigned a TFC number. Table 1 shows exemplary frequency hopping patterns with time or TFCs. Each pattern is assigned a TFC number and shows the frequency subbands occupied by consecutive OFDM symbols.

TABLE 1

Examples of time-frequency codes (TFCs) for band group 1 of a UWB communication system that ranges from 3.168 GHz to 4.752 GHz.

| TFC | k = 0 | k = 1 | k = 2 | k = 3 | k = 4 | k = 5 |
|-----|-------|-------|-------|-------|-------|-------|
| 1 | 1 | 2 | 3 | 1 | 2 | 3 |
| 2 | 1 | 3 | 2 | 1 | 3 | 2 |
| 3 | 1 | 1 | 2 | 2 | 3 | 3 |
| 4 | 1 | 1 | 3 | 3 | 2 | 2 |
| 5 | 1 | 1 | 1 | 1 | 1 | 1 |
| 6 | 2 | 2 | 2 | 2 | 2 | 2 |
| 7 | 3 | 3 | 3 | 3 | 3 | 3 |

In Table 1, the leftmost column shows the TFC numbers or TFC logical channels ranging from 1 to 7. Subsequent columns show the frequency subbands used for transmission during each normalized time k for k=0 through k=5. Each normalized time corresponds to one OFDM symbol that is transmitted during one subband. The hopping period for each of the seven TFC schemes shown in Table 1 is therefore six OFDM symbols. However, within the period of six symbols, some patterns begin repeating within fewer symbols. For example, with TFC numbers of 1 and 2, the hopping patterns repeat after 3 symbols.

The second stage AGC portion includes an amplifier such as a programmable gain amplifier (PGA) 360. In most embodiments, however, the amplifier is an amplifier chain including a plurality of programmable gain amplifiers and a plurality of amplifiers with a preset gain. The PGA receives a baseband signal from the mixer, amplifies the signal, and provides the amplified signal to an ADC 370. The ADC output 371 is intended for use by a digital baseband processor.

The PGA gain is based on a fine AGC signal 333. PGA 360 can implement amplification from 6 dB to 30 dB in steps of 2 dB, as later discussed. In some embodiments, when the received signal may be at different frequency subbands, the PGA 360 has different gain settings for each subband.

In one embodiment all initial gains are set to their respective maximal value, for example to increase detection of very weak signals. For example, the LNA gain is set at 27 dB, the mixer gain is set at 5 dB, and the PGA gain is set at 30 dB, in order to set the receiver to maximal sensitivity. These values thereafter may be refined for example to regulate the clipping of the ADC output to a desirable value.

In one embodiment, the two stages of AGC control the amplitude of the input to ADC such that only about 5% of the ADC output samples are clipped to maximum absolute value.

In some embodiments, and as illustrated in FIG. 3 an RSSI signal 361 is produced by the PGA. The RSSI signal, usually after conversion to digital form, may be used to estimate the RF power ($P_{RF}$) of the received signal 301. For example, the received RF power $P_{RF}$ may be computed by the digital baseband processor based on LNA gain, mixer gain and PGA gain, may be averaged over one OFDM symbol in digital baseband, using a sliding window. Further, an estimate of the received signal power $P_{RSSI}$ may be obtained using the current PGA gain settings as threshold values and compared to the averaged versions of the RSSI measurement result to obtain an estimate of the received RF power $P_{RF}$ from the antenna may be computed as:

$$P_{RF}[dB]=P_{RSSI}[dB]-LNA_{gain}[dB]-mixer_{gain}[dB]-P_{RSSI\_BIAS}[dB]$$

Where $P_{RSSI\_BIAS}[dB]$ is a correction term, if needed or useful, and often implementation dependent.

The received RE power $P_{RF}$ may be used, for example, as an index to a look-up table which stores LNA and mixer gain combinations. Depending on the current estimate of $P_{RF}$, new LNA and mixer gains may be determined, and fed back to the analog RF part, as the coarse AGC gain-setting signal 432, and may also be used for implementations where $P_{RF}$ is calculated at the PGA instead of $P_{RSSI}$.

Figure 4:
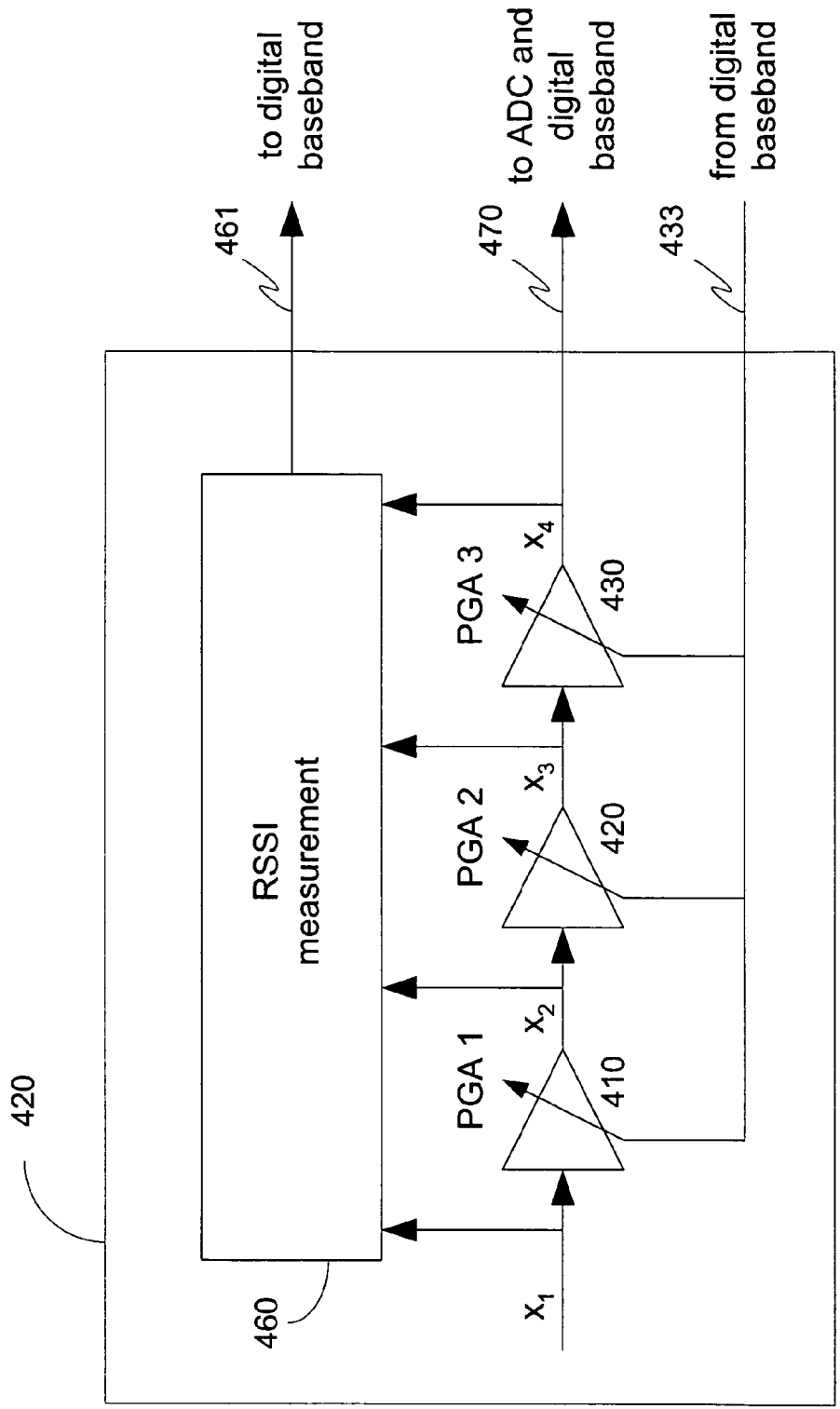
FIG. 4 shows a cascade of three component PGAs forming a PGA block that is being used for received signal strength indicator (RSSI) measurement according to the aspects of the present invention.

FIG. 4 shows a cascade of three component PGAs forming a PGA block 420. In addition, an RSSI measurement block 460 is also shown. The PGA block 420 shown in FIG. 4 may correspond to the PGA 360 of FIG. 3.

Each PGA block 420 of a fine AGC stage may be composed of a cascade of three separate component PGAs 510, 415, 530 that can be separately controlled by the fine AGC gain-setting digital baseband signal or signals. Each of the separate component PGAs in the cascade has a programmable gain, for example of 2, 4, 6, 8, or 10 dB. A control signal 433 from the digital baseband is used to set the gain of each component PGA, with each of the gains separately settable. Outputs from each of the separate component PGAs is provided to the RSSI measurement unit 460, using sampling circuitry in some embodiments. An RSSI signal 461 is obtained from the RSSI measurement unit 460, for provision to the digital baseband stage.

The cascade of PGAs may be used for two purposes: to amplify a received signal and to derive the RSSI 461. The RSSI 461 may be an estimate of the received signal power $P_{RF}$ in dBm. Power in units of dBm is related to power in units of Watts according to the relationship $P[dBm]=10\cdot\log_{10}(P[Watts]/1\ mW))$. The RSSI 461 is obtained by using signals $x_1$, $x_2$, $x_3$, and $x_4$ that are sampled at the output of each component PGA 410, 420, 430. The RSSI 461 may be an analog signal which is analog-to-digital converted for further processed in digital baseband.

Various combinations of gains for each of the three component PGAs may be used to obtain an overall gain for the PGA block. A gain index may be used to determine which combination of component gains is to be used. The gains of component PGAs are added together to set the overall gain. Table 2 shows the PGA gain settings for each of the three component PGAs 410, 415, 430 required to achieve an overall PGA gain from 6 dB to 30 dB. Table 2 may be used to generate the fine AGC signal.

TABLE 2

Gain settings for component PGAs to achieve various overall PGA gains.

| PGA gain index | gain [dB] PGA 1 | gain [dB] PGA 2 | gain [dB] PGA 3 | Overall gain [dB] PGA1-3 |
|---|---|---|---|---|
| 0 | 2 | 2 | 2 | 6 |
| 1 | 4 | 2 | 2 | 8 |
| 2 | 6 | 2 | 2 | 10 |
| 3 | 8 | 2 | 2 | 12 |
| 4 | 10 | 2 | 2 | 14 |
| 5 | 10 | 4 | 2 | 16 |
| 6 | 10 | 6 | 2 | 18 |
| 7 | 10 | 8 | 2 | 20 |
| 8 | 10 | 10 | 2 | 22 |
| 9 | 10 | 10 | 4 | 24 |
| 10 | 10 | 10 | 6 | 26 |
| 11 | 10 | 10 | 8 | 28 |
| 12 | 10 | 10 | 10 | 30 |

As shown in Table 2, A PGA gain index varies between 1 and 12. The gain index may be used to set the gain for the three component PGAs. The gain in dB of each of the component PGAs 410, 420, 430 are shown in subsequent columns, with the overall gain of the three cascaded component PGAs is shown in the rightmost column. The gain of each of the component PGAs can take values 2, 4, 6, 8, or 10. The overall gain is obtained by adding the gains of the three components and varies from 6 to 30 dB in increments of 2. For example, to obtain an overall gain of 6 dB, each component PGA may have a gain of 2 dB. To obtain an overall gain of 30 dB, the maximum overall gain in one embodiment, and used as an initial value of gain for the PGA, each component PGA is set to have a gain of 10 dB.

Figure 5:
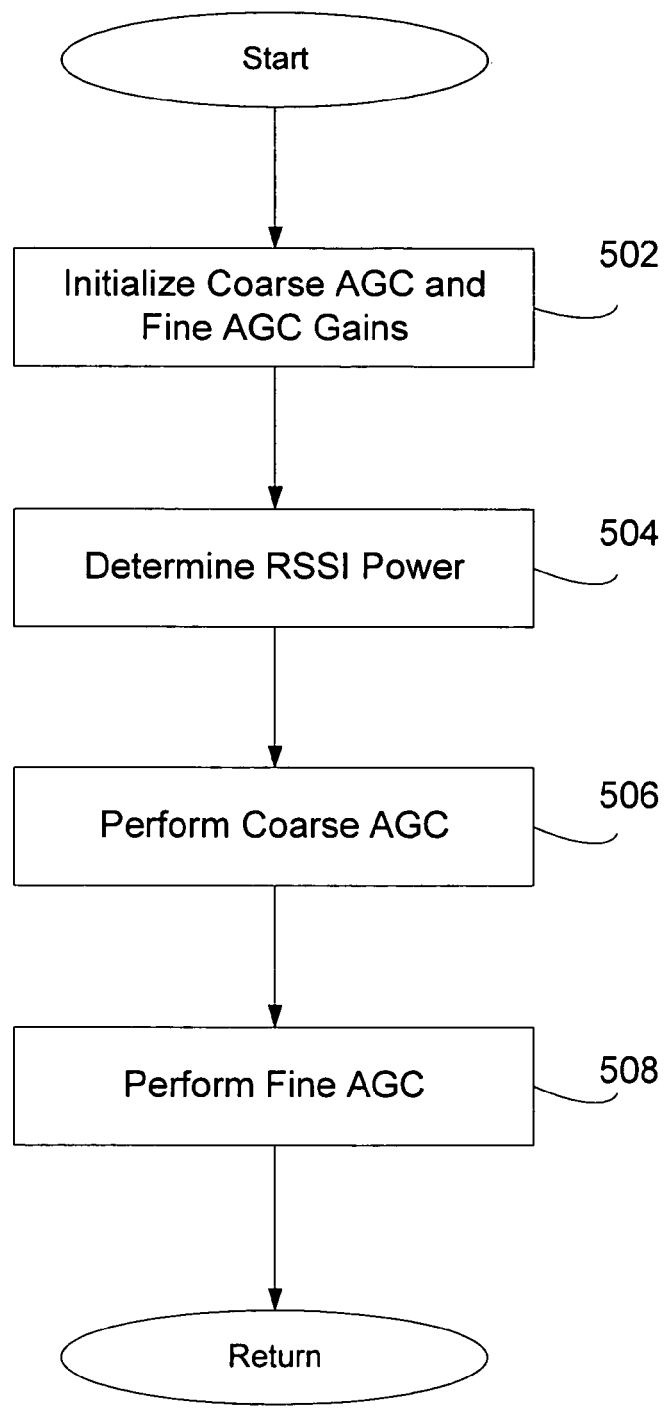
FIG. 5 is a flow diagram of a process for performing AGC in accordance with aspects of the invention.

FIG. 5 is a flow diagram of a process for performing AGC. Preferably AGC is performed during reception of a preamble portion of a packet. In block 502 the process of a coarse AGC gain and a fine AGC gain are initialized. In one embodiment the gains are set to maximum values, which may be accomplished by setting both a course AGC gain signal and a fine AGC gain signal. This may be done, for example to increase the sensitivity of detection of the signals arriving at the receiver to a maximum.

In block 504 the process determines an indication of received signal strength. In some embodiments this is accomplished by determining an RSSI signal. In some embodiments this is accomplished by extracting an intermediate signal within an RF processing block, and subtracting out gains expected from components in the signal processing chain prior to extraction. For example, the signal may be extracted subsequent to the LNA and mixers, and gains associated with these elements are subtracted from a strength of the extracted signal.

In block 506 the process performs a coarse AGC. In many embodiments this comprises selecting a gain level based on the indication of received signal strength and providing the selected gain level to at least some gain elements in the RF processing block. In many embodiments the gain elements receiving the selected gain level, which may be considered a coarse AGC gain level, are the LNA and the mixer or mixers.

In block 508 the process performs a fine AGC. In many embodiments a digital baseband receives outputs of an ADC, evaluates the level or average level of the outputs of the ADC, and selects a fine AGC gain level based on the evaluation. Preferably the gain level is selected such that no more than 5% of the ADC outputs are at a maximum or minimum for the ADC outputs. The gain level is provided to gain elements of the RF processing block, preferably programmable gain elements of an amplifier chain. The process performed in block 508 is in many embodiments an iterative process repeated over several consecutive received symbol periods.

The process thereafter returns.

Figure 6:
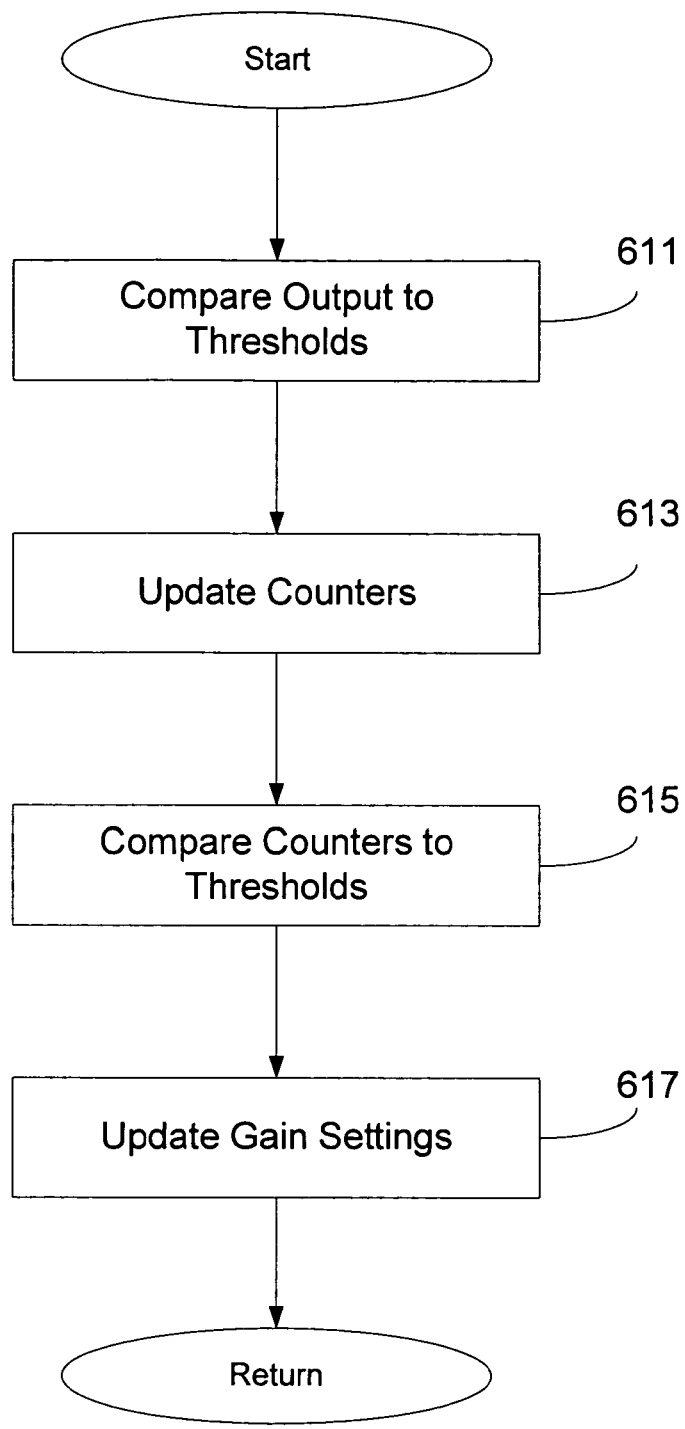
FIG. 6 is a flow diagram of a further process for performing AGC according to the aspects of the present invention.

FIG. 6 is an embodiment of a process for performing fine AGC. In block 611 the process compares ADC outputs to various thresholds, which may be preset or programmable by way, for example, of external registers. In block 613 the process updates counters based on whether the ADC outputs exceed, or in some embodiments do not exceed, the thresholds. In block 615 the process compares the counters to further thresholds. In block 617 the process updates the gain settings, preferably just the AGC fine gain settings, based on the result of the comparison of the counters to the further thresholds. The process thereafter returns.

The process of FIG. 6 is more fully comprehended considering the example of FIG. 10a and FIG. 10b. FIG. 10A shows a two-bin histogram for using with counters and FIG. 10B shows the number of ADC output samples exceeding certain threshold values versus time.

For fine tuning the fine AGC stage, output samples of the ADC block may be examined to determine if the magnitudes of the output samples satisfy a desirable criteria. If too many of the output samples are considered to have an undesirably large magnitude, then the gain of the AGC may be reduced. A reduced AGC gain results in a smaller analog input to the ADC and smaller ADC output samples. If the output samples happen to have undesirably small magnitudes, then a feedback to the fine AGC stage increases the gain and adjust the output of the AGC stage upward.

The desirable criteria may be a range, a maximum value not to be exceeded, or a minimum value not to fall below. One method of evaluating the output samples of the ADC block is to form a histogram of the magnitudes of the output samples that counts the number of output samples falling within various ranges. Then, different criteria may be applied to different ranges of the histogram. One embodiment of the invention, uses a two-bin histogram to classify the output samples of the ADC block according to their magnitude.

A two-bin histogram 1010 is used to count how many of the ADC output samples have absolute values between two specified threshold values a1, a2 and how many have absolute values exceeding both limits, preferably during a sliding window of one OFDM symbol. The sliding window of one OFDM symbol may, for example, correspond to the time it takes for one of the OFDM symbols 701-704 of FIG. 7 to be received at the receiver. The absolute values of the output signals from the ADC correspond to the real component of the complex output signals. In FIG. 10, a1<a2. The corresponding counted values are c1, c2 such that the ADC output samples exceeding the threshold a2 are counted in bin c2 and the samples exceeding the threshold a1, but smaller than a2, are counted in bin c1. The thresholds a1, a2 can be provided by external register settings.

In plot 1020, the values y of the ADC output signals are plotted versus time. A max and a min value are marked on the plot 1020. The ADC output signals having a value y above the max or below the min are clipped by the ADC. Therefore, it is desirable to lower the PGA gain such that the symbol entering the ADC is not clipped while keeping the gain high enough to maintain sensitivity. Hence, the histogram 1010 counts the ADC outputs exceeding the threshold values a1 and a2 to keep the total number of those that are too high or too low few by fine-tuning the PGA gain.

The fine AGC stage may performed for each subband separately. Therefore, for each frequency subband, such as subband 1, subband 2 and subband 3, a separate two-bin histogram is maintained.

Depending on the two-bin histogram 1010 measurements, the gain is increased or decreased in subsequent fine AGC steps after the initial step.

One exemplary way of changing the PGA gain index 350 of Table 2 depending on the histogram measurements 1010 is as follows:

---

IF (COUNT1<c2≦2xCOUNT1) THEN gain_index=gain_index−1; (slow decrease)
ELSE IF (c2>2xCOUNT1) THEN gain_index=gain_index−2; (fast decrease)
IF (0.5xCOUNT2<c1≦COUNT2) THEN gain_index=gain_index+1; (slow increase)
ELSE IF (c1<0.5xCOUNT2) THEN gain_index=gain_index+2; (fast increase)

---

Where COUNT1 and COUNT2 can be provided by external registers. COUNT1 is a limit selected for the bin collecting the ADC outputs between a1 and a2 and COUNT2 is a limit selected for the bin collecting the outputs exceeding a2.

Figure 7:
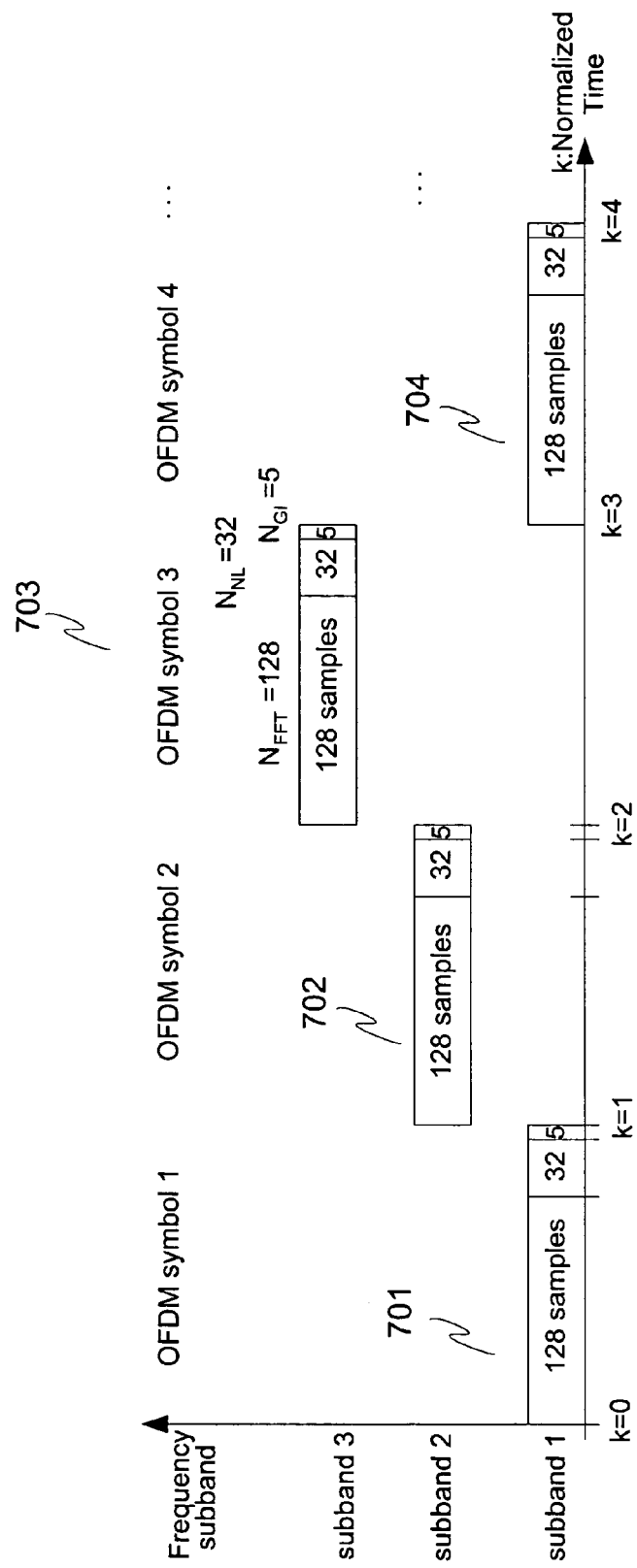
FIG. 7 is a diagram showing an exemplary OFDM symbol structure and an exemplary frequency hopping pattern for the OFDM symbols.

FIG. 7 is a diagram showing an exemplary OFDM symbol structure and an exemplary frequency hopping pattern for the OFDM symbols. As shown in FIG. 7, the OFDM symbol includes a predetermined number of samples that are divided into several categories or groups. Some groups of the samples include data being transmitted. Other groups of samples do not include any data or include a repetition of earlier data and are used to increase process ability to the OFDM symbol. Other groups of samples are used to guard against the effects of interference between symbols that arrive successively through different channels and are subject to path dispersion. Also, shown in FIG. 7 is the frequency hopping pattern of the OFDM symbols. The symbols may stay in the same frequency band or may hop from band to band according to a pattern.

Thus, the exemplary plot of FIG. 7 shows the frequency subbands used for transmission of OFDM symbols 701, 702, 703, 704 versus normalized time. An exemplary OFDM symbol such as a third OFDM symbol 703 of FIG. 7 includes a fast Fourier transform (FFT) window, a null prefix or postfix (NL), and a guard interval (GI). In digital baseband, each OFDM symbol includes 165 complex samples. With an exemplary sampling frequency of 528 MHz=1/Ts, the number of samples usable for a FFT operation, or the FFT window size, is $N_{FFT}$=128 samples. The null prefix, which is actually a postfix in the OFDM symbol shown, has a length of $N_{NL}$=32 samples that are set to zero at the transmitter. The guard interval samples have a length of $N_{GI}$=5 samples.

All OFDM symbols may be transmitted on a same frequency or, as shown in FIG. 7, each OFDM symbol may be transmitted on a different frequency. A frequency-hopped OFDM may be implemented where the center frequency of the transmitted OFDM symbol is changed for every OFDM symbol according to a frequency hopping pattern determined by a TFC number. This is referred to as time-frequency interleaving. The frequency hopping occurs toward the end of the OFDM symbol during the guard interval $N_{GI}$. For example in FIG. 7 frequency hopping occurs at or around discrete normalized time k=160 and during the 5 last samples within the guard interval. The transient effects, resulting from the switching of RF frequency, are supposed to happen during the guard interval. Thus, the $N_{GI}$ samples of the guard interval are invalid and are skipped not to be further used in the digital baseband processing.

In FIG. 7, three frequency subbands, subband 1, subband 2, and subband 3 are shown on the vertical axis. The normalized time shown on the horizontal axis is obtained as k=t/$T_S$ where t is time in seconds, $T_S$ is the sampling period in seconds, and the normalized time k is dimensionless. A first OFDM symbol 701 is transmitted on the subband 1, a second OFDM symbol 702 is transmitted on subband 2, a third OFDM symbol 703 is transmitted on subband 3, and a fourth OFDM symbol 704 is transmitted on subband 1 again with the same frequency hopping pattern repeating thereafter. The frequency hopping scheme of FIG. 7 is subband 1, subband 2, subband 3, subband 1 again, and repeating thereafter. This scheme corresponds to the TFC number 1 in Table 1.

Figure 8:
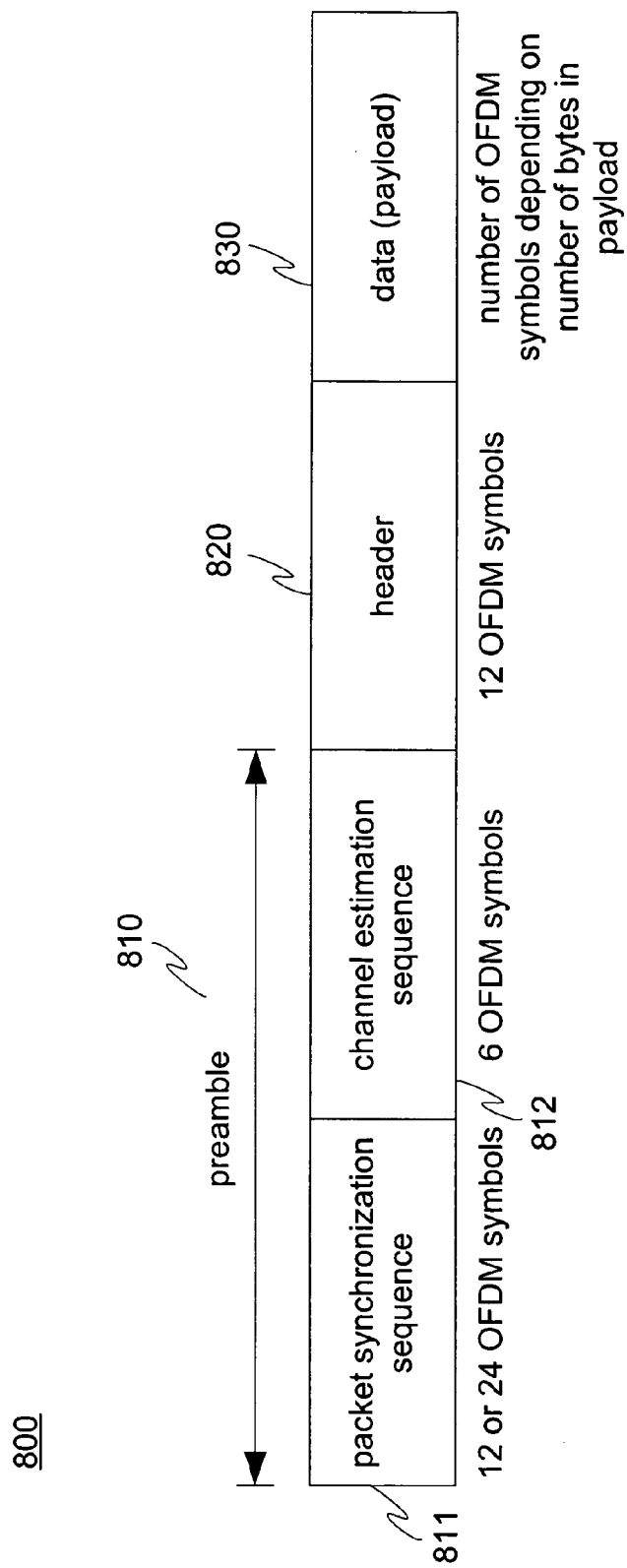
FIG. 8 shows an exemplary packet format for a signal including OFDM symbols.

FIG. 8 shows an exemplary packet format 800 for a signal including OFDM symbols. Transmission of OFDM symbols may be organized in packets and each packet may contain many OFDM symbols. A packet may include a preamble, a header and a payload part. In the preamble, a predetermined number of OFDM symbols, that are transmitted first, form a packet synchronization sequence that may be used for packet detection, frame synchronization, and AGC. The remaining symbols of the preamble form a channel estimation sequence that may be used for demapping at a receiver. The payload part includes the data.

In a packet-based communication system AGC may be typically performed during the receiving of the preamble, with dedicated time-windows for performing the gain adjustments of the different stages of the RF part.

An exemplary packet 800 comprises a preamble 810, a header 820 and a payload part 830. The preamble 810 may be long including 30 OFDM symbols or short including 18 OFDM symbols. In the preamble 810, the first 24 OFDM symbols, for a long preamble, or the first 12 OFDM symbols, for a short preamble, form a packet synchronization sequence 811. The packet synchronization sequence 811 is used for packet detection, frame synchronization, and AGC. The remaining 6 symbols of the preamble 810 form a channel estimation sequence 812 whose symbols are used to perform channel estimation. The channel estimates are used for coherent demapping in the data processing block 120 of the receiver of FIG. 1. The header 820 may contain 6 OFDM symbols. The payload part 830 includes the data and contains as many OFDM symbols as required to convey the number of bytes in the payload.

Figure 9A:
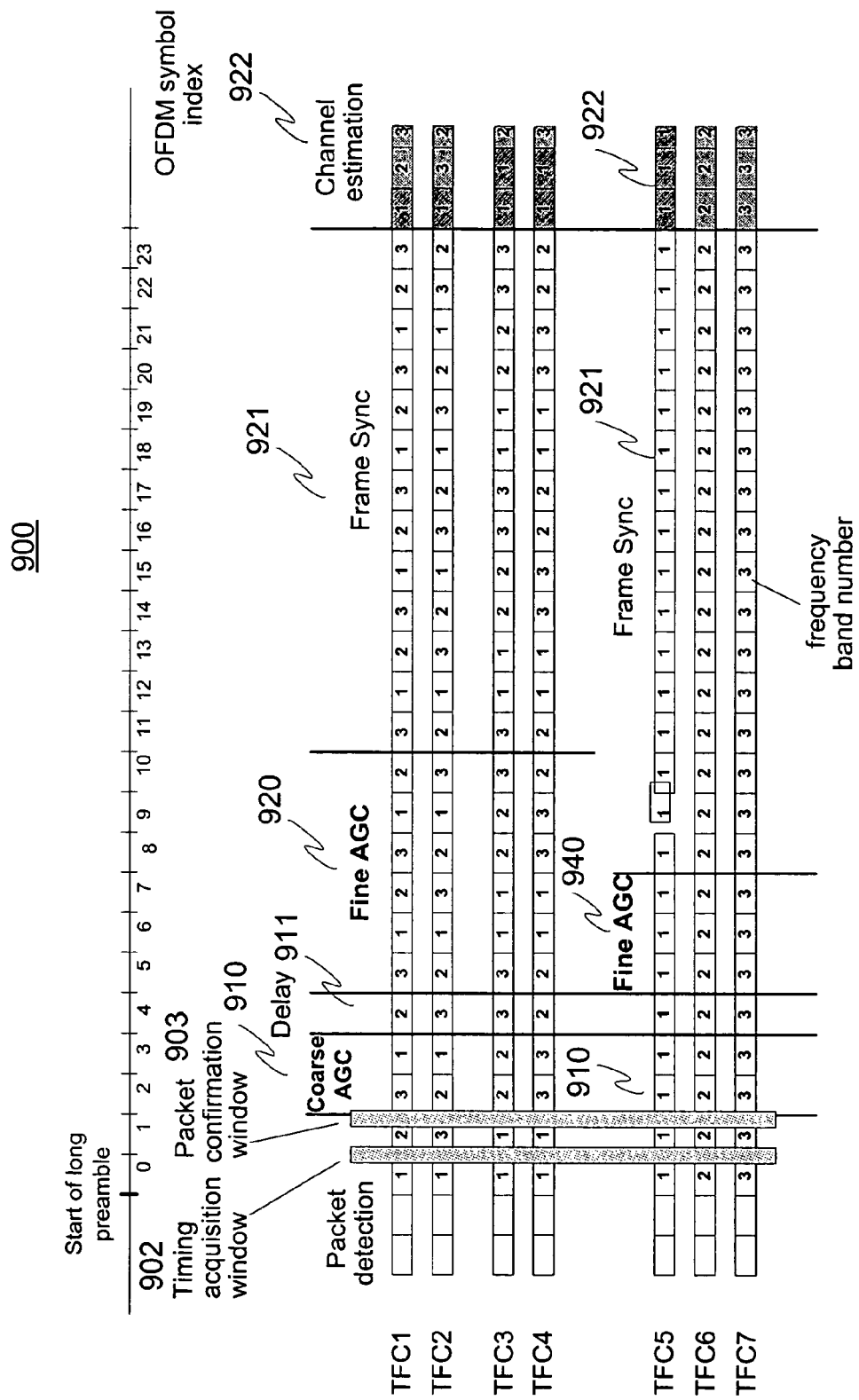
FIG. 9A shows a sequence of events for a packet format having a long preamble for various time-frequency hopping patterns used during signal processing according to the aspects of the present invention.
Figure 9B:
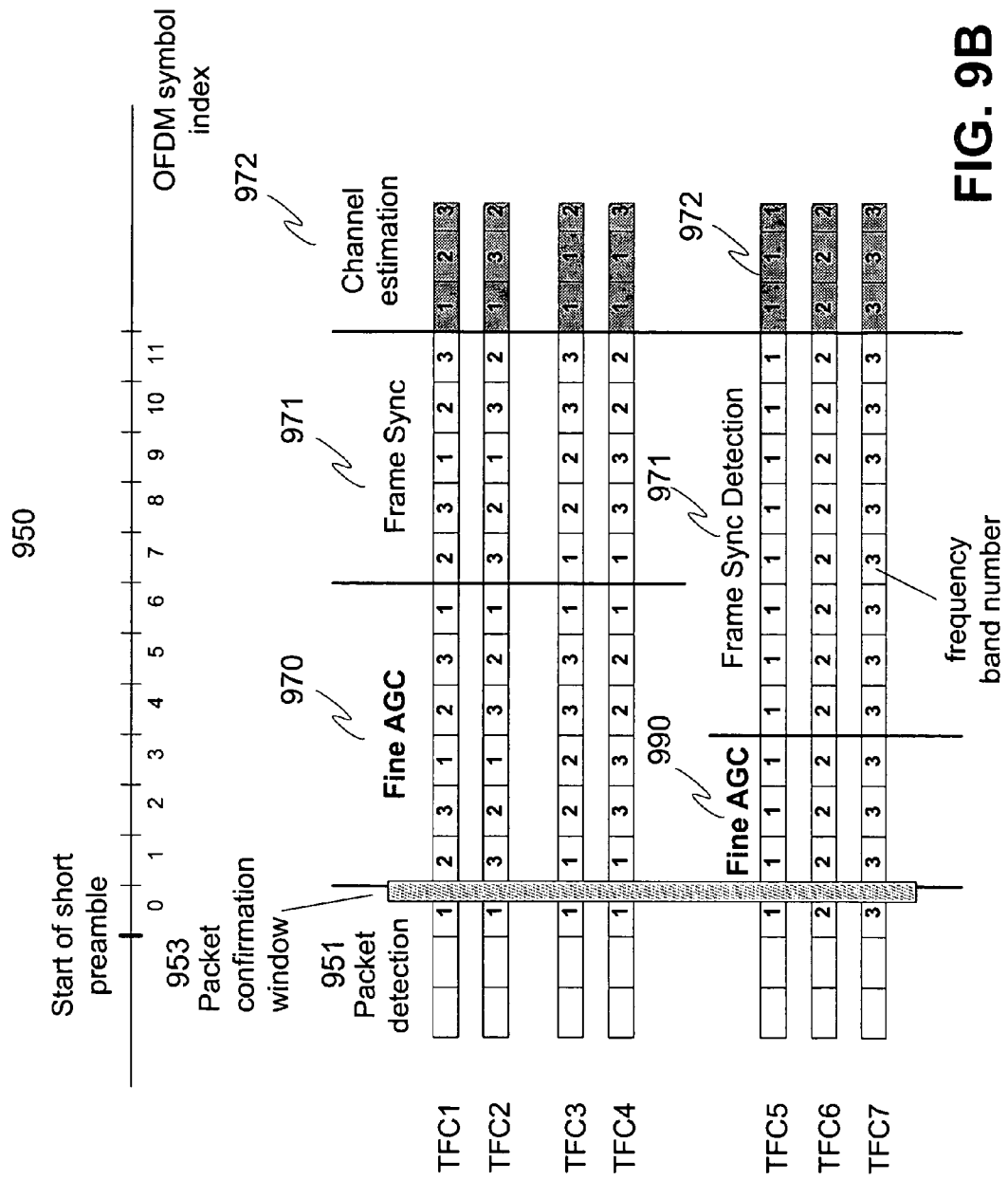
FIG. 9B shows a sequence of events for a packet format having a short preamble for various time-frequency hopping patterns used during signal processing according to the aspects of the present invention.

FIG. 9A shows a sequence of events for a packet format having a long preamble 900 for various time-frequency hopping patterns used during signal processing. FIG. 9B shows a sequence of events for a packet format having a short preamble 950 for various time-frequency hopping patterns used during signal processing. The time-frequency hopping patterns are identified by the corresponding TFC number shown in Table 1.

A data packet may have a long or a short preamble. In some embodiment packets having a long preamble are treated differently from the packets having a short preamble for AGC purposes. For example, short preambles generally are used as a part of data bursts where the first packet includes a long preamble that may be used to perform a coarse AGC. The results of the coarse AGC of the first packet in the burst is later applied to the packets following the first packet if they happen to include a short preamble. Thus, the symbols of a long preamble may be used to first perform a coarse AGC and then to perform a fine AGC. When a packet arrives having a short preamble, only a fine AGC is performed, with the results of the coarse AGC performed on a previous packet applied to the packet having the short preamble.

The fine AGC may also operate differently on packets that are received on different time-frequency hopping patterns corresponding to different TFC numbers. When successive OFDM symbols hop from one frequency band to another, corresponding to TFC1-TFC4, then a larger number of symbols may be used for performing the fine AGC operation. When all of the symbols are arriving on the same frequency subband, corresponding to TFC5-TFC6, then a fewer number of symbols may be used for performing the fine AGC operation. The coarse AGC is capable of using the same number of symbols whether or not different frequency bands are used by the symbols. The gains are updated at the end of each OFDM symbol during the coarse AGC. After the coarse AGC stage has determined the gains of the components used in the coarse AGC portion, then fine AGC is performed. The fine AGC stage fine-tunes the overall gain per subband.

FIGS. 9A and 9B each include the 7 frequency hopping schemes corresponding to TFC numbers of 1 through 7 shown in Table 1. For TFC number equal to 1, the frequency bands used by successive OFDM symbols hop from 1 to 2 to 3 and then back to 1. For TFC number equal to 2, the frequency bands used by successive OFDM symbols hop from 1 to 3 to 2 and then back to 1. For TFC number equal to 3, the frequency bands used by successive OFDM symbols hop from 1 to 1 to 2 to 2 to 3 to 3 and then back to 1 and 1 repeating the same double hop pattern. For TFC number equal to 4, the frequency bands used by successive OFDM symbols hop from 1 to 1 to 3 to 3 to 2 to 2 and then back to 1, repeating the same double hop pattern. TFC numbers 5, 6, and 7 correspond to no frequency band hopping. At TFC number equal to 5, successive OFDM symbols stay in frequency subband 1. At TFC number equal to 6, successive OFDM symbols stay in frequency subband 2. At TFC number equal to 7, successive OFDM symbols stay in frequency subband 3.

FIG. 9A shows the schedule of a coarse AGC 910 for a packet having the long preamble 900. For all TFC values 1-7 that are listed in Table 1, the OFDM symbols with index 2 and index 3, i.e. those that use the frequency subbands 2 and 3 as shown in FIG. 7, are used to perform the coarse AGC. The gains are updated at the end of each OFDM symbol during the coarse AGC 910.

FIG. 9B shows the schedule for a packet having the short preamble 950. No coarse AGC is performed for this type of packet. Instead, the coarse AGC settings are kept from a previous packet. A short preamble is only used for packets that are part of a burst of packets, where the first packet always has a long preamble that is used to determine coarse AGC gain settings. Subsequent packets of the same burst, optionally might use a short preamble for reduced overhead and, in turn, higher throughput. A receiver physical layer, such as the physical layer of the receiver of FIG. 1, is told by a MAC whether to expect a long or a short preamble for the next incoming packet.

In both FIGS. 9A and 9B, only portions that correspond to the packet synchronization sequence 811 part of the preamble 810 in FIG. 8 are shown. The first sample in each packet is used for packet detection 901, 951. In FIG. 9A for the packet with the long preamble, a timing acquisition window 902 follows the first sample and a packet confirmation window 903 follows the second sample. However, for a packet with the short preamble of FIG. 9B, only a packet confirmation window 953 follows the first symbol.

After the coarse AGC 910, FIG. 9A includes a delay 911 of one sample. FIG. 9B does not include a coarse AGC or a subsequent delay. Both FIGS. 9A and 9B include fine AGC periods 920, 940, 970, 990 followed by frame synchronization 921, 971 and finally channel estimation 922, 972 after the long or short preamble 900, 950 samples have been exhausted.

The TFC5-TFC7 hopping patterns that correspond to no frequency band hopping, have a shorter fine AGC 940, 990 period than the TFC1-TFC4 which involve actual frequency band hopping. As a result, the frame synchronization periods 921, 971 of these TFC patterns are longer.

During the fine AGC stage, the PGA gains of each of the subbands are updated at the end of each OFDM symbol. The schedule for the fine AGC stage 920, 940, 970, 990 depicted in FIG. 9A for the packet 900 having a long preamble and in FIG. 9B for the packet 950 having a short preamble, takes into account the frequency hopping pattern for the particular TFC used.

With respect to FIG. 9A, after the coarse AGC 910, a delay of one OFDM symbol 911 allows the analog circuitry in the RF part to settle on the new LNA and mixer gain settings obtained by the coarse AGC stage. Because the fine AGC 920 is performed per subband, the particular frequency hopping pattern depending on the TFC number needs to be taken into account. The period of the hopping patterns is 6 OFDM symbols as indicated in Table 1. For TFC1-TFC4, the fine AGC 920 is performed over 6 OFDM symbols, with 2 OFDM symbols having the same subband. Then each subband occurs twice during the fine AGC stage 920 and the PGA gain for each subband is updated two times during the fine AGC stage 920. The update of the PGA gain occurs as explained in the description of FIG. 4 above and FIG. 10A and FIG. 10B below. For TFC5-TFC7, the fine AGC 940 is performed over 3 OFDM symbols with all 3 OFDM symbols having the same subband. Then, the subband corresponding to the TFC group occurs three times during the fine AGC stage 940 allowing to update the PGA gains three times for the single subband used.

For example, for TFC6 all of the OFDM symbols use the same frequency subband 2. Further, during the fine AGC 940 the PGA gains of the subbands being used are updated at the end of each OFDM symbol. The second frequency subband, subband 2, is therefore used three times during the fine AGC stage 940 to transmit all three symbols. As a result, the gain of the PGA, such as PGA 520, is updated three times during the fine AGC stage 940.

With respect to FIG. 9B, no coarse AGC is performed for the short preamble packet. Instead, the coarse AGC settings of the previous packet are carried over. The schedule for the fine AGC 970, 990 in this case is identical to the long preamble processing. Therefore, 6 OFDM symbols are used for TFC1-TFC4, and 3 OFDM symbols are used for TFC5-TFC7. The PGA gain is, therefore, updated 3 times for each frequency subband 1 through 3, during the fine AGC stage 970, 990 for a packet having a short preamble as well.

Figure 11:
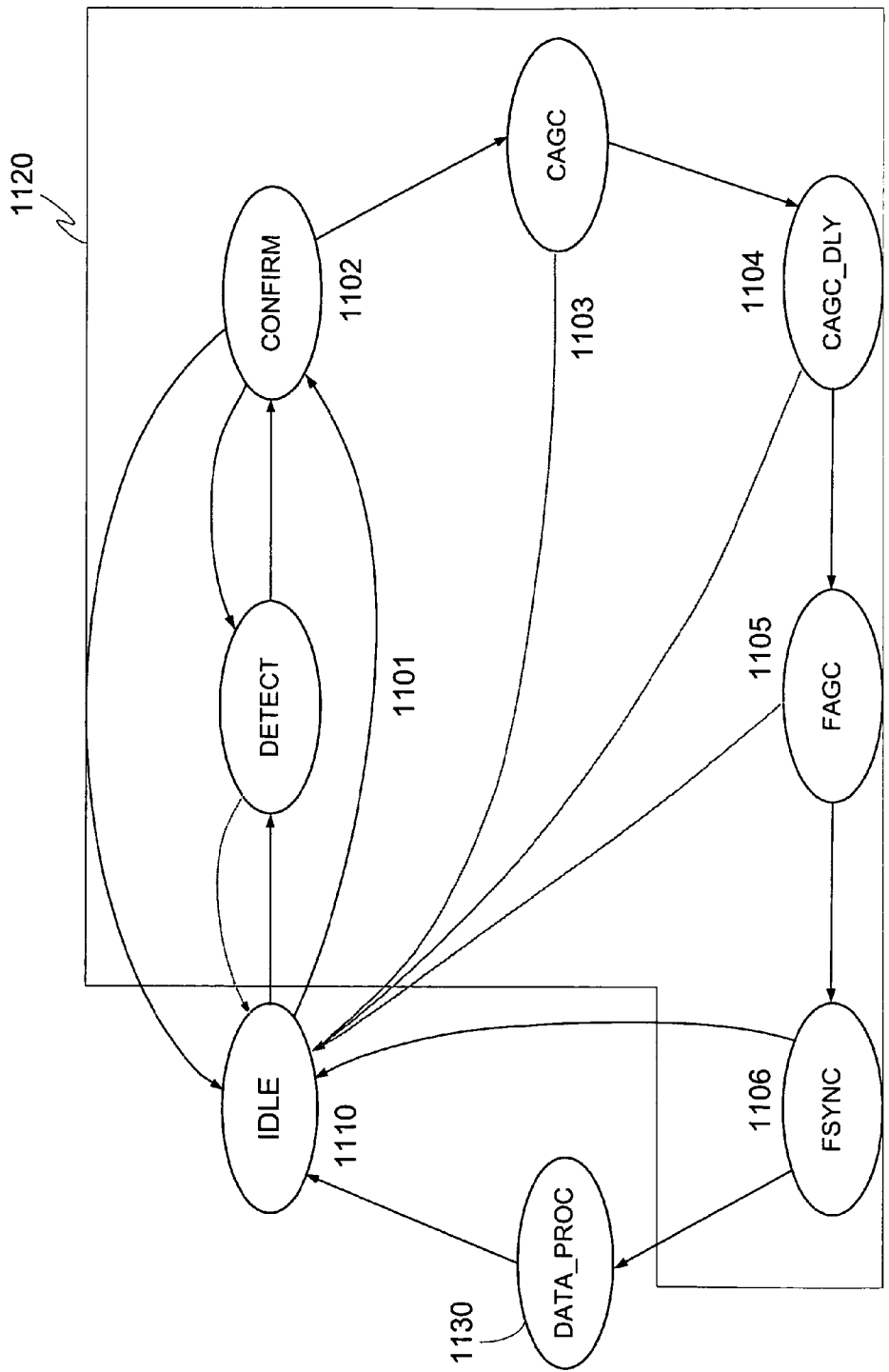
FIG. 11 shows an exemplary state machine representation for the signal processing part of a receiver according to the aspects of the present invention.

FIG. 11 shows an exemplary finite state machine (FSM) representation for a signal processing part 1120 and a data processing part 1130 that may respectively correspond to the signal processing and data processing parts of the receiver of FIG. 1. During the signal processing part 1120, the FSM controls the orchestration of the different elements. The FSM includes dedicated states for packet detection 1101 and confirmation 1102, coarse and fine automatic gain control 1103, 1105 and frame synchronization 1106, that correspond to the signal processing part 1120. A coarse AGC delay state 1104 is also located between the coarse AGC state 1103 and the fine AGC state 1105. After the signal processing part 1120 is complete, control is handed over to the data processing part 1130 which takes care of FFT, demapping, deinterleaving and Viterbi decoding. Any of the states may revert to an idle state 1110 after data processing or signal processing operations are complete.

Although the invention has been described with respect to certain specific embodiments, it should be recognized that the invention comprises the claims and their equivalents supported by this disclosure and insubstantial variations thereof.

What is claimed is:

1. An automatic gain control (AGC) method for frequency-hopped OFDM ultra-wide band communication, OFDM symbols hopping over a plurality of frequency subbands, the method comprising:
performing a coarse gain control during a first AGC stage; and
refining results of the coarse gain control during a second AGC stage;
wherein the first AGC stage determines a common low noise amplifier gain and a common mixer gain for all subbands within the plurality of subbands,
wherein the first AGC stage updates the common low noise amplifier gain and the common mixer gain using received signal strength indication measurements during the second AGC stage,
wherein the second AGC stage determines a programmable gain amplifier gain such that substantially 5% of the output samples are clipped to maximal absolute value.

2. The AGC method of claim 1:
wherein the first AGC stage averages the common low noise amplifier gain and the common mixer gain over a first sliding window over one OFDM symbol,
wherein the second AGC stage determines a programmable gain amplifier gain for each subband within the plurality of subbands.

3. The AGC method of claim 2:
wherein the second AGC stage determines the programmable gain amplifier gain by using a two-bin histogram measurement of output samples of an analog to digital converter for each subband within the plurality of subbands,
wherein the second AGC stage averages the histogram measurement over a second sliding window over one OFDM symbol.

4. The AGC method of claim 3:
wherein the OFDM symbols are received in groups forming a packet, the packet having a preamble including a plurality of OFDM symbols,
wherein the first AGC stage and the second AGC stage are performed during receiving the preamble.

5. The AGC method of claim 4:
wherein the first AGC stage and the second AGC stage are performed when the preamble is long, the long preamble including 24 OFDM symbols,
wherein only the second AGC stage is performed when the preamble is short, the short preamble including 12 OFDM symbols,
wherein the first AGC stage and the second AGC stage are performed depending on a frequency band hopping pattern of the OFDM symbols being received.

6. The AGC method of claim 5:
wherein the OFDM symbols are received over more than one antenna, and wherein the first AGC stage and the second AGC stage are performed separately for the OFDM symbols received over each antenna.

7. An automatic gain control (AGC) method for frequency-hopped OFDM ultra-wide band communication, OFDM symbols hopping over a plurality of frequency subbands, the method comprising:
performing gain control during a first AGC stage; and
refining results of the gain control during a second AGC stage;
wherein the first AGC stage determines a common low noise amplifier gain and a common mixer gain for all subbands within the plurality of subbands,
wherein the first AGC stage updates the common low noise amplifier gain and the common mixer gain using at least one characteristic of the received signal during the second AGC stage,
wherein the second AGC stage determines a programmable gain amplifier gain for clipping a portion of the output samples to a maximal absolute value, and
wherein the first AGC stage averages the common low noise amplifier gain and the common mixer gain over a sliding window over one OFDM symbol.

8. The AGC method of claim 7, wherein the second AGC stage determines a programmable gain amplifier gain for each subband within the plurality of subbands.

9. The AGC method of claim 8, wherein the second AGC stage averages the histogram measurement over a second sliding window over one OFDM symbol.

10. The AGC method of claim 7, wherein at least one characteristic of the received signal comprises received signal strength indication (RSSI) measurements.

11. An automatic gain control (AGC) method for frequency-hopped OFDM ultra-wide band communication, OFDM symbols hopping over a plurality of frequency subbands, the method comprising:
performing coarse gain control during a first AGC stage; and
performing fine gain control during a second AGC stage;
wherein the first AGC stage determines a common low noise amplifier gain and a common mixer gain for all subbands within the plurality of subbands,
wherein the first AGC stage updates the common low noise amplifier gain and the common mixer gain using at least one characteristic of the received signal during the second AGC stage,
wherein the second AGC stage determines a programmable gain amplifier gain for clipping a portion of the output samples to a maximal absolute value, and
wherein the second AGC stage determines a programmable gain amplifier gain for each subband within the plurality of subbands.

12. The AGC method of claim 11, wherein the first AGC stage averages the common low noise amplifier gain and the common mixer gain over a first sliding window over one OFDM symbol.

13. The AGC method of claim 12:
wherein the second AGC stage determines the programmable gain amplifier gain by using a two-bin histogram measurement of output samples of an analog to digital converter for each subband within the plurality of subbands,
wherein the second AGC stage averages the histogram measurement over a second sliding window over one OFDM symbol.

14. The AGC method of claim 13:
wherein the OFDM symbols are received in groups forming a packet, the packet having a preamble including a plurality of OFDM symbols,
wherein the first AGC stage and the second AGC stage are performed during receiving the preamble.

15. The AGC method of claim 14:
wherein the first AGC stage and the second AGC stage are performed when the preamble is long, the long preamble including 24 OFDM symbols,
wherein only the second AGC stage is performed when the preamble is short, the short preamble including 12 OFDM symbols,
wherein the first AGC stage and the second AGC stage are performed depending on a frequency band hopping pattern of the OFDM symbols being received.

16. The AGC method of claim 15:
wherein the OFDM symbols are received over more than one antenna, and wherein the first AGC stage and the second AGC stage are performed separately for the OFDM symbols received over each antenna.

17. The AGC method of claim 11, wherein at least one characteristic of the received signal comprises received signal strength indication (RSSI) measurements.

\* \* \* \* \*